United States Patent
Bennett et al.

(10) Patent No.: US 6,919,125 B2
(45) Date of Patent: Jul. 19, 2005

(54) DUAL COMPOSITION CERAMIC SUBSTRATE FOR MICROELECTRONIC APPLICATIONS

(75) Inventors: Kriss Allen Bennett, Torrance, CA (US); Roy Tom Coyle, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/632,152

(22) Filed: Aug. 1, 2003

(65) Prior Publication Data

US 2005/0025945 A1 Feb. 3, 2005

(51) Int. Cl.[7] ................................................. B32B 3/00
(52) U.S. Cl. ....................... 428/210; 428/209; 428/212; 428/472.2; 174/258
(58) Field of Search ................................ 428/209, 210, 428/212, 218, 472.2; 174/258

(56) References Cited

U.S. PATENT DOCUMENTS

| | | | | |
|---|---|---|---|---|
| 4,464,420 A | * | 8/1984 | Taguchi et al. ............... 427/96 |
| 4,598,107 A | * | 7/1986 | Herron et al. ............... 523/351 |
| 4,655,864 A | * | 4/1987 | Rellick ..................... 156/89.18 |
| 5,300,163 A | * | 4/1994 | Ohtaki ..................... 156/89.15 |
| 5,866,240 A | * | 2/1999 | Prabhu et al. ............... 428/210 |
| 6,017,410 A | * | 1/2000 | Baccini ....................... 156/290 |
| 6,531,209 B2 | * | 3/2003 | Polis et al. ................. 428/212 |

* cited by examiner

Primary Examiner—Cathy F. Lam
(74) Attorney, Agent, or Firm—Ronald M. Goldman; Scot R. Hewitt

(57) ABSTRACT

Ceramic substrates (1) for microelectronic modules are formed in multiple layers (7 & 9) fused into a unitary one-piece assembly. The layers contain the same ceramic material but in different purity so that one outer layer (9) is optimal in composition for bonding to a thick film conductor (11) and the other outer layer (7) is optimal in composition for bonding to a thin film conductor (13). In a dual composition substrate embodiment one layer is formed of a 96% alumina composition and the second layer is formed of a 99.6% alumina composition.

5 Claims, 1 Drawing Sheet

DUAL COMPOSITION CERAMIC SUBSTRATE FOR MICROELECTRONIC APPLICATIONS

STATEMENT OF GOVERNMENT RIGHTS

This invention was conceived or developed during the course of Contract 083290 with an agency of the U.S. Government. The government possesses certain rights in this invention.

FIELD OF THE INVENTION

The present invention relates to microelectronic modules and, more particularly, to the ceramic substrate that serves as the support for the RF and DC interconnects within the microelectronic module.

BACKGROUND

A microelectronic module typically includes a semiconductor or other active device, electronic components, strip-line and/or wiring and interconnects, and a substrate that supports the foregoing elements. The substrate is a plate, wafer, panel or disk of suitable material on which (or in which) the components of an electronic unit, such as an integrated or printed circuit, semiconductor or other active device, electronic components, strip-line and interconnect wiring are deposited or formed. Accordingly, the material and shape of the substrate must possess physical and electrical properties suitable to the foregoing application. Typically, that material is a dielectric, an electrical insulator and the substrate is flat and relatively rigid.

Because of the desirable physical and electrical properties possessed by ceramic material, such as compositions of alumina ($Al_2O_3$), the ceramic is recognized as the material of choice for the substrate in microelectronic modules, providing the base on which to fabricate microelectronic semiconductors, printed wiring, electrical interconnects and the like. The ceramic material can be formed into the appropriate hard flat wafer or plate typically required of a module substrate.

The composition of a ceramic substrate for a microelectronic module application typically a percentage of alumina that may range between a maximum of just under 100% alumina and, at a minimum, 96% alumina. The remaining ingredients in the composition being a suitable binder that holds together the powder of the alumina and/or a combination of binder and a material proprietary to the manufacturer. Thus, in practice the alumina substrate never contains 100% alumina. Ceramic substrates are commercially available to the industry that are formed of compositions having a variety of standard percentages of alumina within the foregoing range of compositions. As example, 99.6% (by weight) alumina and 96% (by weight) alumina are two known commercially available compositions of ceramic substrate favored for microelectronic modules.

To manufacture the alumina substrate, alumina powder is physically broken apart by a ball mill to yield the desired size or range of sizes of particulate. Then the particulate is dispersed into a liquid forming a slurry. Particulate forms of glass, which serves as a high temperature binder, and polymer binders are added to complete the slurry. Small amounts of other, proprietary dielectric materials may be added to the slurry by the manufacturer. That slurry is adjusted to a viscosity that the manufacturer finds suitable to subsequent processing to form the substrate.

In one known process the slurry is evenly deposited on a flexible membrane, the carrier film, and formed into a film of constant thickness by applying (e.g. skiving) the slurry onto the surface of the carrier film using the edge of a flat blade, spreading the slurry evenly over the surface, a spreading procedure known as swiping, drying (e.g. firing) the slurry, followed by separating the dried slurry from the carrier film. When separated from the carrier film, the dried slurry forms a leather-like layer or film, referred to as "green tape." In many operations, the carrier film comprises a moving belt that carries the slurry covered carrier film from the region of the blade through a dryer in a continuous process to produce the green tape.

The green tape can be cut, shaped or formed as desired. The green tape (or, as appropriate, a cut out or shaped portion of the green tape) is then placed in an oven or kiln and fired to temperatures in the range of 1600 Degrees Centigrade. At that high temperature, the glass (and any other component of the binder) melts or re-vitrifies, while the aluminum oxide remains a solid. Revitrification of the glass forms a matrix of the aluminum oxide and the binder. On cooling a hard rigid ceramic dielectric body of the desired shape for the substrate results.

A second known substrate manufacturing technique is to press glass and alumina powder mixture into a mold under high pressure to form a body to the desired shape. The inherent friction between the particulate of that mixture holds that body together initially. Thereafter, the formed body is fired as in the preceding process to form a bond of greater strength between the particulate material and produce the fused mixture.

The surface roughness of the fired substrate depends on the particle size of the alumina used to form the green tape. Some such substrate may be used "as fired" for subsequent processing that is tolerant of or requires a degree of surface roughness, such as in applications that use or apply thick films to the substrate. On the other hand, thin film applications are less tolerant of surface roughness due to the desired finish and the photolithographic processing employed to image the thin film on the substrate in lithographic processes. Most thin film applications thus require a substrate that has a polished surface. A sanding or grinding operation that uses diamond grit is used for that polishing.

Two familiar types of interconnects for a microelectronic module are RF interconnects and DC interconnects. The former is used to conduct RF energy from one location to another on a substrate, and the latter is used to conduct DC current from one location to another. The RF interconnect is typically in the form of a thin film, and the DC interconnect is, typically, a thick film. Frequently, both an RF interconnect and a DC interconnect are carried on a single substrate.

Thin film (eg. thin electrically conductive film) is applied to the substrate by metalization of the substrate surface, and is accomplished by a vapor deposition process. Typically titanium and tungsten are deposited in succession in 200 Angstrom thick layers, referred to as the bonding layer; depositing a layer of resistive material, such as tantalum nitride, to about a 200 Angstrom thickness; sputter depositing pure gold (eg. 99.99%) gold to a thickness of 10,000 Angstroms to form the "seed" layer, and then wet plating. The lines or pattern of electrically conductive lines, pads or regions are formed in the foregoing metallized layer or film using conventional photo-etch techniques, leaving other portions of the surface of the substrate exposed. Thereafter the formed lines can again be wet plated with gold by immersing the substrate in a wet plating bath, wherein the gold adheres to the conductive lines, but not to the substrate.

On the other hand, thick films are typically applied to a substrate using a screening process. In that process a photomask is applied to a very fine mesh polymeric or metallic screen and exposed in the negative image of the desired pattern. Then the unexposed portion is removed leaving the desired film pattern open. The electrically conductive film material is then squeegeed through the openings in the screen onto the surface of the substrate. Thereafter the substrate undergoes a series of high temperature treatments to solidify the thick film and the bond of the thick film to the surface of the substrate, the details of which are not material to an understanding of the invention. Thick film adheres poorly to a substrate. When a large substrate is subjected to a wide range of temperatures in application, the thick film may delaminate from the substrate.

Experience has taught that a substrate formed of a 99.6% (by weight) of alumina provides the best surface for the thin film (RF interconnect) processing, and that a substrate formed of a 96% (by weight) of alumina provides the best surface for the thick film (DC interconnect) processing. The foregoing difference in result is due in small part to the inherent surface finish of the two different compositions. For the most part the difference is believed due to the differences in reaction between the processes used to apply the materials that form the thick and thin films, respectively, to the ceramic substrate.

To the present, production engineers for microelectronic modules of the type that contain a substrate to support both thick and thin film conductors are forced to choose between a substrate composition whose physical characteristic better serves to bond to and support thin conductive film, that is, the 99.6% alumina composition, or bond to and support thick conductive film, that is, the 96% alumina composition. The compromise or choice in microelectronic module production is a ceramic substrate for the module that is optimal for application of thin conductive films (eg. the 99.6% alumina composition), notwithstanding the fact that the substrate must also bond to and support thick conductive films. As a consequence, de-lamination of the thick film from the good substrate occurs from time to time, decreasing the production yield of substrate or resulting in premature failure of the electronic module in which the substrate was applied.

The foregoing choice of ceramic substrate characteristic is due to the experience that an even lower production yield would occur if the physical characteristic of the substrate were to favor bonding of the thick conductive film. As an advantage, the present invention and method provides the appropriate physical characteristic to both the thin conductive film and the thick conductive film and, hence, enhances production yield of ceramic substrates and the reliability of the modules that use the substrate, even though the substrate is more complicated to manufacture than present ceramic substrates.

The new substrate retains the desired physical characteristics required for the additional aspects of substrate fabrication such as thick film filled communication vias, laser profiling for complex shapes and the inclusion of passive electrical elements formed of either or both thin conductive film and thick conductive film.

Accordingly, an object of the present invention is to improve of the production yield of ceramic substrates for microelectronic modules that incorporate both thick and thin conductive films and to increase the operational life of such microelectronic modules.

Another object of the invention is to produce a ceramic substrate that contains top and bottom surfaces of the same ceramic material but possess different physical characteristics, the physical characteristics of one being optimal for adherence of thick conductive film and the physical characteristics of the other being optimal for adherence of thin conductive film.

And still another object of the invention is to provide optimal adherence of the thick film conductors used for transmission of DC current and of the thin film conductors used for transmission of RF in substrates that support both such types of conductors concurrently.

SUMMARY OF THE INVENTION

In accordance with the forgoing objects and advantages, the ceramic substrate of the invention contains upper and lower side surfaces that differ in composition. One of the surfaces contains the percentage of ceramic material that is optimal for the application of a thin film conductor, and the other opposed surface contains the percentage of ceramic material that is optimal for the application of a thick film conductor.

In a specific embodiment of the invention the one surface is 99.6% (by weight) alumina and the opposite surface is 96% (by weight) alumina. In accordance with a more specific aspect to the invention, the substrate may be comprised of two or more layers of ceramic material with one outer layer being formed of a 99.6% alumina composition and the other outer layer being formed of the 96% alumina composition. Any intermediate layers formed between the foregoing two layers is formed of a composition containing a percentage of alumina greater than 96% and less than 99.6%. The respective layers may be of the same thickness, or may be of different thickness. Alternatively, some layers may be of the same thickness and other layers may differ in thickness.

In a more specific embodiment the number of layers may be increased to a large number with each layer being very thin to produce a composition gradient through the thickness of the structure extending from one surface at a 96% alumina composition to the other surface at a 99.6% alumina composition. The composition gradient may be linear through the thickness or may be non-linear.

In accordance with the new method, the ceramic substrate is produced by forming a layer of a composition that is optimal for the application of thick conductive film, forming over the foregoing layer a layer of a composition that is optimal for the application of thin conductive film, and, afterward, firing the the two layers to form a one piece unitary assembly.

In a more specific aspect of the method, a layer of 96% Alumina is skived onto a flexible membrane and dried to form a 96% green tape. Then a layer of 99.6% Alumina is skived onto the 96% green tape to overlye the 96% Alumina layer. Then the foregoing assembly is fired to the re-vitrification temperatures of the glass binder contained in the alumina to form a unite the layers into a unitary assembly. The unitary assembly is then removed from the heat and permitted to cool down. The result is a flat ceramic body of a predetermined thickness containing two strata of slightly different composition in a one-piece unitary assembly or laminate.

One side or surface of the assembly contains or exposes the one composition, such as the 99.6% alumina; the opposite side or surface contains or exposes the other composition, such as the 96% alumina. Should thermal expansion or contraction be uneven because of the difference in the physical thermal characteristic of the two compositions, the ceramic body may bow slightly after processing and cooling to room temperature. Should a bow form, the body should be processed further to grind the surfaces flat. Further, post-processing may also result in a polished surface to the side containing the 99.6% alumina, should the intended application of the substrate require or make polishing desirable.

The foregoing and additional objects and advantages of the invention, together with the structure characteristic thereof, were only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

Figure 1:
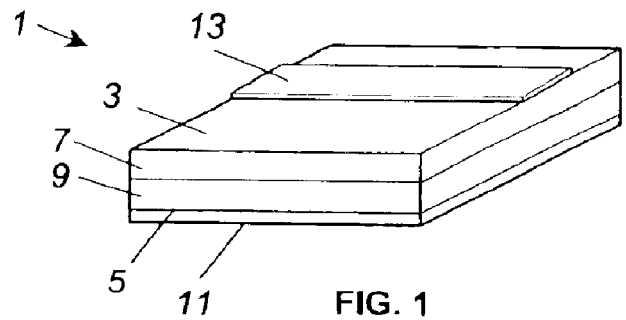
FIG. 1 illustrates a preferred embodiment of a substrate for a microelectronic module constructed in accordance with the invention.

Reference is made to FIG. 1 illustrating an embodiment of the invention, a dual composition ceramic substrate 1 with a thick film 11 and thin film 13 attached. The ceramic substrate is a flat, stiff rectangular plate that contains upper and lower flat surfaces, 3 and 5, respectively. The substrate is a laminate assembly containing multiple strata or, as variously termed, layers 7 and 9, integrated together. The respective layers are of a selected height or thickness, and together define the thickness of the substrate. Typical thickness for a practical embodiment, as example, is between 0.1 millimeters and 1.5 millimeters for substrates used in microelectronic modules familiar to the inventors. Thick film 11 is attached to bottom surface 5 of layer 9 and thin film 13 is attached to upper surface 3, both of which films are more fully described hereafter.

Substrate 1 is constructed of aluminum oxide (alumina), more specifically, aluminum oxide in the form of particulate material that is fused together. The individual layers in the substrate are formed of different mixes of the same essential ingredients. Lower layer 9 is formed of the 96% aluminum oxide composition, a known composition. As described in the introduction, the foregoing composition comprises 96% aluminum oxide (by weight) and the remainder binder and/or binder and material proprietary to the supplier of the material. Upper layer 7 is formed of the 99.6% aluminum oxide composition, another known composition. As was also described in the introduction, the foregoing composition comprises 99.6% aluminum oxide (by weight) and the remainder binder and/or binder and material proprietary to the supplier of the material. The upper surface 3 of the substrate is the exposed side of the upper layer 7. The lower surface 5 of the substrate is the exposed side of lower layer 9. The remaining side of the upper and lower layers are in abutting relationship.

Particle size and size distribution is important to finished surface roughness. In general, the 99.6% surface is preferably polished to four micro-inch (RMS) maximum roughness and the 96% surface is polished to approximately twenty-five micro-inch (RMS) maximum roughness. To enable accomplishment of those ends with polishing the 99.6% Alumina slurry, described in the introduction, used to fabricate the layer will typically be formed of particles of Alumina that are finer in size than those that form the 96% Alumina slurry.

To accomplish the principal purpose of the invention the values of 96% alumina at lower surface 5 and 99.6% Alumina at upper surface 3 need be present only at the respective surfaces. The particular depth or thickness of the 96% alumina layer versus the 99.6% Alumina layer and the particular transition profiles through the thickness of substrate 1 is a matter of method and practicality of implementation. Thus, a layer may be of infinitesimal thickness or of greater thickness, as desired.

For completeness, thick film 11 is shown attached to the bottom surface 5 and, preferably, covers the bottom surface of the substrate. As an example, thick film 11 may be a multi-layer structure containing alternate layers of metal, such as gold, and dielectrics with interconnecting vias that form a complex distribution of bias voltages and other control signals using standard thick film materials and fabrication processes. As an example, in application as part of an electronic module, conductive film 11 may serve as the ground portion of the DC current carrying conductors and, additionally, serve as the RF ground plane conductor. Since the surface to which the thick film is attached is 96% alumina, the optimal composition (texture) for thick film, the mechanical or chemical bond of the thick film to the substrate is optimal.

Further, a thin film structure 13 is shown attached to the upper surface 3 of the substrate. As an example, that film may be formed of gold or other appropriate combination of metal and resistor materials, and is formed on the substrate surface using any known technique, preferably, the process referred to in the introduction of this specification. As an example, in application as part of an electronic module, conductive film 13 may serve as a microwave stripline type of transmission line that provides a path to conduct RF energy from one location on the substrate to another. Since the surface to which the thin film is attached is 99.6% alumina, the optimal composition (texture) for thin film, the mechanical or chemical bond of the thin film to the substrate is optimal. Being more densely packed with the aluminum oxide, a dielectric material, the region underlying the formed stripline possesses lower surface roughness that results in better line definition than the less densely packed and more rough 96% alumina layer. The higher dielectric constant, as is known, provides a beneficial effect in the RF propagation characteristics of the stripline.

It should be realized that the particular shape of the plate defining the substrate and the shape, size and thickness of the conductive films bonded to the substrate depicted in FIG. 1 are not specific to any particular microelectronic module and are not drawn to scale. The illustrated embodiment is intended to illustrate the invention free from unnecessary detail of any electronic circuits and the like that are not material to and do not aid in understanding the invention.

Figure 2:
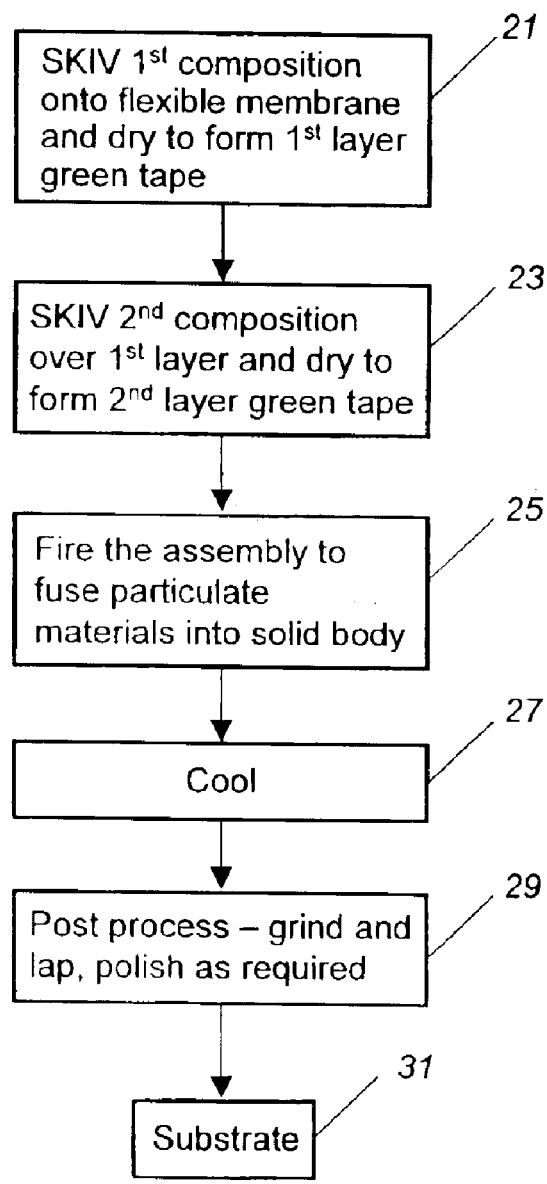
FIG. 2 illustrates the method of fabricating the substrate of FIG. 1.

The substrate is fabricated in part using the green tape procedure earlier briefly described, and, preferably, uses the skiving technique referred to in the introduction to this specification. Reference is made to FIG. 2, which illustrates the method of preparing the substrate of FIG. 1. A 96% Alumina slurry is skived onto a carrier film to a height that is of the desired thickness for layer 9 and then dried, as represented by block 21. This forms a first layer that is of the leathery form of green tape. Then, as represented by block 23, the 99.6% Alumina slurry is then carefully skived over the 96% alumina layer in the desired layer thickness, while the previously formed 96% alumina layer holds its shape. Then the second layer is dried to form a dual composition green tape that is removed from the carrier film. The dual composition green tape can now be cut or otherwise formed into the desired finished shape.

The intermediate assembly thus formed is then placed in an oven and is fired to the re-vitrification temperatures of the glass binder in the respective alumina compositions, represented by block 25. The two layers thereby solidify and fuse together into a single one-piece assembly. Removed from the oven, the assembly is permitted to cool down, block 27.

The formed substrate is surface ground and lapped to provide the desired finish flatness and thickness, block 29. If required the surface that is of 99.6% alumina may be polished further to produce a smoother finish to complete post-processing. The result is a flat ceramic body of a predetermined thickness containing two strata of slightly different composition in a one-piece unitary assembly, a laminate 31. One side or surface of the body contains or exposes the one composition, such as the 99.6% alumina; the opposite side or surface contains or exposes the other composition, such as the 96% alumina. As an advantage, the improved substrate is fabricated using existing technology, and does not require extensive research or development to place into industrial practice.

The embodiment of FIG. 1 contains two layers. As is appreciated, other embodiments may contain three or more separate layers whose composition may change from layer to layer. As example in an embodiment that contains three layers the middle layer may contain a percentage of alumina that falls between the 96% alumina and 99.6% alumina compositions of the two outer layers, such as 97.5% alumina. In embodiments with more than three layers, the change in percentage of alumina from layer to layer is reduced to even smaller changes. With a large number of layers, the percentage change from layer to layer may be said to be graduated linearly. Alternatively, the composition of the multiple layers may be defined by a gradient that changes in the percentage of alumina non-linearly.

As one appreciates, any embodiments of the invention that contain more than two layers of ceramic composition as described to achieve a desired alumina profile through the depth of the substrate is accomplished in the same way as with two layers, and that is by building up the substrate layer by layer on the carrier tape to form the composite green tape. A separate slurry of the desired composite is prepared for each layer in the substrate, each layer above the first layer is skived onto a prior dried layer of a previously skived and dried layer, and is dried in turn. When all the layers have been formed in that way, the carrier tape is removed and the composite green tape so formed is fired to the temperature of revitrification (e.g. fusing) of the binder and fusing of the layers together in a unitary one-piece assembly. Grinding and polishing is employed as in the process for the double layer embodiment of FIG. 1.

The ceramic substrates in the foregoing embodiments used compositions of alumina. As those skilled in the art, other dielectric ceramic compositions may be used instead of alumina, as example, Barium Titanate. Whichever ceramic is chosen for use in a practical embodiment, in accordance with the present invention, one side surface of one outer layer should be of a composition that the prior art or experiment determines to be-optimal for the bonding of a thin film conductor and the side surface of the other outer layer should be of a composition that is different from that of the one outer layer and that is optimal for bonding of a thick film conductor.

As one appreciates, the method of fabricating the substrate involves a greater number of operations than the prior substrates and, hence, will be more expensive to produce. The advantage of the invention shines in those applications of microelectronic circuits in which reliability and long service life of the microelectronic circuit is given priority, not price, such as in applications in outer space, in satellites and the like in which a failed microelectronic circuit cannot be easily repaired or replaced.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A ceramic substrate for bonding to and supporting at least one electrically conductive trace for conduction of DC current and at least one electrically conductive trace for conduction of RF current in a microelectronic module, comprising:

a ceramic body having first and second side surfaces, with said first side surface overlying said second side surface;

said first side surface possessing a physical characteristic more favorable to adherence of a conductive trace for conduction of RF current than is said second side surface and said second side surface possessing a physical characteristic more favorable to adherence of conductive trace for conduction of DC current than is said first side surface;

said ceramic body including a plurality of layers of sintered dielectric material, one of said plurality of layers comprising an outer layer to said ceramic body and defining said first side surface and another one of said layers comprising an outer layer to said ceramic body and defining said second side surface to said ceramic body;

said one of said plurality of layers comprising a first vitrified composition of powdered ceramic material, binder and other dielectric material;

said powdered ceramic material of said first vitrified composition comprising a first predetermined percentage by weight of said first vitrified composition and comprising aluminum oxide;

said another one of said plurality of layers comprises a second vitrified composition of said powdered ceramic material, binder and other dielectric material; and said powdered ceramic material in said second vitrified composition comprising a second predetermined percentage by weight of said second vitrified composition and comprising aluminum oxide, said second predetermined percentage being less than said first predetermined percentage, and wherein said first predetermined percentage is 99.6 percent and wherein said second predetermined percentage is 96 percent.

2. The ceramic substrate as defined in claim 1, wherein each of said first and second sides is flat.

3. The ceramic substrate as defined in claim 1, wherein said plurality of layers comprises at least two.

4. A non-metallic electrically nonconductive ceramic substrate for an electronic module, said ceramic substrate having first and second opposed side surfaces and being of a predetermined thickness, said first surface being of a ceramic composition that is optimal in physical characteristic for bonding to a thin film conductor and said second surface being of a composition that is optimal in physical characteristic for bonding to a thick film conductor, said latter composition being different than said former composition, said ceramic composition that is optimal in physical characteristic for bonding to a thin film conductor comprises aluminum oxide and binder in which said aluminum oxide constitutes 99.6% by weight of said composition; and said composition that is optimal in physical characteristic for bonding to a thick film conductor comprises aluminum oxide and binder in which said aluminum oxide constitutes 96% by weight of said composition.

5. In an microelectronic module a substrate for supporting electronic devices and interconnects, said substrate having upper and lower sides and comprising first and second layers fused together to form an integral assembly, said first layer defining a flat surface to said upper side and said second layer defining a flat surface to said lower side, said first layer further comprising a first fused mixture of aluminum oxide power and binder in which said aluminum oxide powder in said first fused mixture comprises 99.6% by weight of said first fused mixture, and said second layer further comprising a second fused mixture of aluminum oxide powder and binder in which said aluminum oxide powder in said second fused mixture comprises 96% by weight of said second fused mixture; a thin film conductor deposited on and attached to said upper side; and a thick film conductor plated on and attached to said lower side.

* * * * *